(12) United States Patent
Ha et al.

(10) Patent No.: US 7,023,675 B2
(45) Date of Patent: Apr. 4, 2006

(54) POWER SUPPLY FOR MEASURING THE LINE IMPEDANCE OF UNDERGROUND CABLE

(75) Inventors: Che-wung Ha, Gumi-shi (KR); Jung-nyun Kim, Gumi-shi (KR)

(73) Assignee: LG Cable Ltd., (KR)

( * ) Notice: Subject to any disclaimer, the term of this patent is extended or adjusted under 35 U.S.C. 154(b) by 109 days.

(21) Appl. No.: 10/683,137

(22) Filed: Oct. 9, 2003

(65) Prior Publication Data

US 2005/0248324 A1    Nov. 10, 2005

(30) Foreign Application Priority Data

Oct. 10, 2002  (KR) ...................... 10-2002-0061647

(51) Int. Cl.
*H02H 9/08*  (2006.01)

(52) U.S. Cl. .................. 361/47; 361/93.1; 363/40; 363/44; 336/148

(58) Field of Classification Search ............ 363/40–49, 363/71, 155, 153, 154, 90, 70; 336/137, 336/145, 148; 324/649, 652, 55, 57, 59; 323/343, 364; 361/42, 47, 93.01
See application file for complete search history.

(56) References Cited

U.S. PATENT DOCUMENTS

| | | | |
|---|---|---|---|
| 3,852,641 A * | 12/1974 | Titus ........................... | 361/47 |
| 4,297,738 A * | 10/1981 | Lee ............................. | 361/42 |
| 5,081,411 A | 1/1992 | Walker | |
| 5,530,748 A | 6/1996 | Ohmori | |
| 6,522,119 B1 | 2/2003 | Hernandez | |
| 6,861,936 B1 * | 3/2005 | Kamath ....................... | 336/148 |

* cited by examiner

*Primary Examiner*—Rajnikant B. Patel
(74) *Attorney, Agent, or Firm*—Daniel B. Schein, Esq., Inc.

(57) ABSTRACT

Disclosed is a power supply for measuring the line impedance of an underground cable, which includes an input terminal section having a plurality of input terminals, a plurality of autotransformers, a transformer adjustment tap, a plurality of 3rd-harmonics cancellation transformers, and an output terminal section having a plurality of output terminals. The autotransformers are connected respectively to the input terminals. The transformer adjustment tap is connected to all of the autotransformers. The 3rd-harmonics cancellation transformers are connected respectively to the autotransformers. The output terminals are connected respectively to the 3rd-harmonics cancellation transformers. The autotransformers are simultaneously controlled by the transformer adjustment tap so as to uniformly boost the powers supplied respectively to the autotransformers, and 3rd-harmonics of the powers are cancelled in the 3rd-harmonics cancellation transformers to remove noise, so that the powers are stably applied respectively to the phases of the underground cable.

2 Claims, 2 Drawing Sheets

POWER SUPPLY FOR MEASURING THE LINE IMPEDANCE OF UNDERGROUND CABLE

BACKGROUND OF THE INVENTION

1. Field of the Invention

The present invention relates to a power supply for measuring the line impedance of an underground cable, and more particularly to a power supply for measuring the line impedance of an underground cable comprising an input terminal section including a plurality of input terminals connected to a power source; a plurality of autotransformers connected respectively to the input terminals of the input terminal section; a transformer adjustment tap connected to all of the autotransformers; a plurality of 3rd-harmonics cancellation transformers connected respectively to the autotransformers; and an output terminal section including a plurality of output terminals connected respectively to the 3rd-harmonics cancellation transformers, whereby the autotransformers are simultaneously controlled by the transformer adjustment tap to equally transform power supply voltages supplied respectively to the autotransformers, and 3rd-harmonics of the powers are cancelled in the 3rd-harmonics cancellation transformers to remove noise, so that the powers are applied in a stable manner respectively to the phases of the underground cable conductor.

2. Description of the Related Art

In order to measure the line impedance of an underground cable, power is applied individually to each of the A, B and C phases of the underground cable conductor, and the voltage, current and power factor of each power source applied is measured. The measured value is then calculated while classifying the underground cable into a positive-phase-sequence circuit and a zero-phase-sequence circuit, so as to calculate the positive-phase-sequence component impedance and the zero-phase-sequence component impedance of the underground cable.

In the prior art, power is boosted at a predetermined transformation rate using three single-phase transformers and three single-phase slidacs (or variable transformers), and the boosted power is then applied individually to each phase of an underground cable conductor, so as to measure the impedance of the underground cable. This conventional impedance measurement method has the following problems. First, it is very difficult to boost the power, which is applied respectively to the phases of an underground cable conductor, at the same transformation rate. In addition, since the measurement is affected by the third harmonics, large errors occur in the measured impedance values. Further, there are risks that an abrupt voltage variance may cause a cut in power of the underground cable line or breakage of impedance measurement equipment.

SUMMARY OF THE INVENTION

Therefore, the present invention has been made in view of the above problems, and it is an object of the present invention to provide a power supply for measuring the line impedance of an underground cable, wherein a plurality of autotransformers are simultaneously controlled by a transformer adjustment tap to boost the power supplied respectively to the autotransformers at the same transformation rate, and the 3rd-harmonics of the powers are cancelled in a 3rd-harmonics cancellation transformer to remove noise, whereby the powers boosted at the same transformation rate are applied in a stable manner to the phases of the underground cable, respectively.

In accordance with the present invention, the above and other objects can be accomplished by the provision of a power supply for measuring line impedance of an underground cable comprising: an input terminal section including a plurality of input terminals connected individually to a power source; a plurality of autotransformers connected respectively to the input terminals of the input terminal section; a transformer adjustment tap connected to all of the autotransformers; a plurality of 3rd-harmonics cancellation transformers connected respectively to the autotransformers; and an output terminal section including a plurality of output terminals connected respectively to the 3rd-harmonics cancellation transformers.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, a preferred embodiment of the present invention will be described in detail with reference to the drawings.

Figure 1:
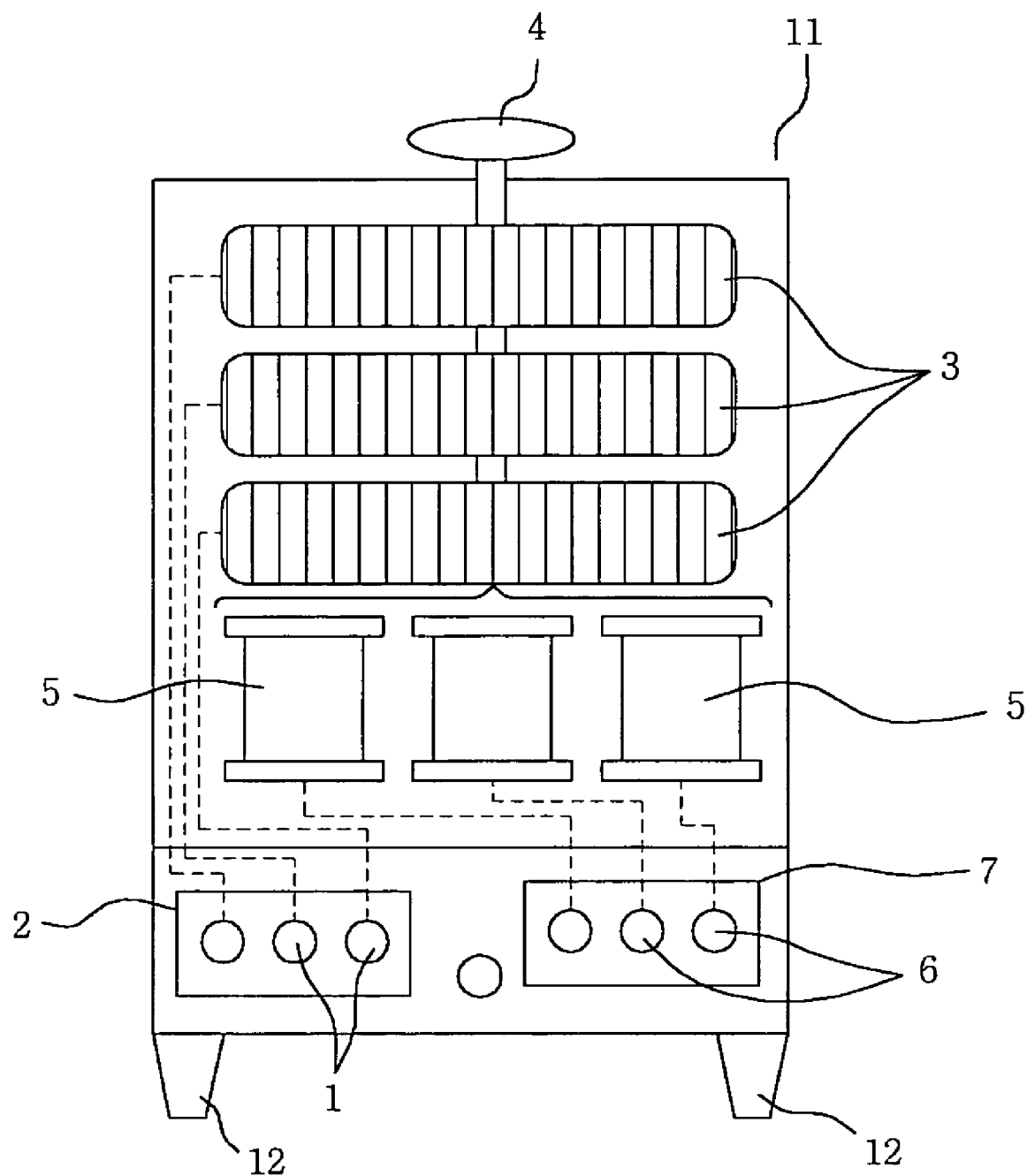
FIG. 1 shows the configuration of a power supply for measuring the line impedance of an underground cable according to the present invention.
Figure 2:
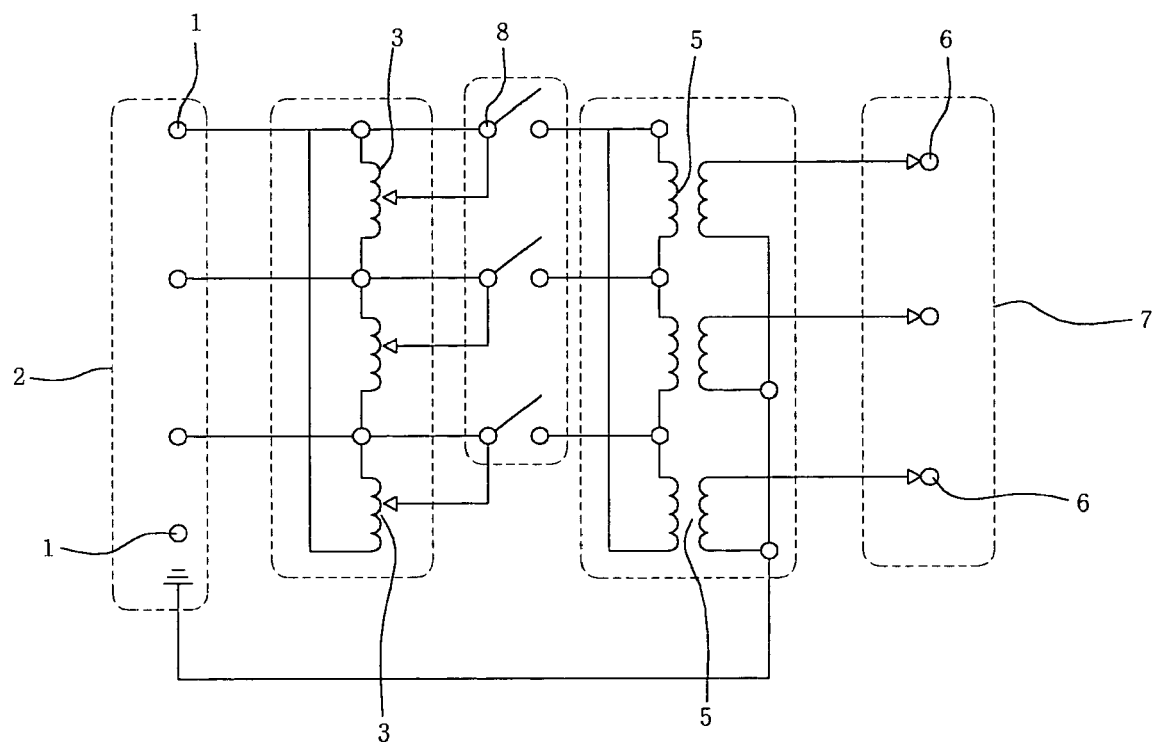
FIG. 2 shows a circuit of the power supply for measuring the line impedance of the underground cable according to the present invention.

As shown in FIGS. 1 and 2, in order to measure the impedance of a three-phase underground cable, an input terminal section 2 composed of three input terminals 1 is formed on a body 11 of a specific size at a lower portion thereof. Each input terminal 1 of the input terminal section 2 is individually connected to the utility power, so that powers to be used to measure the underground cable impedance are inputted to the input terminals 1, respectively.

Three autotransformers 3 connected respectively to the input terminals 1 of the input terminal section 2 are formed vertically in parallel inside the body 11 at an upper portion. A transformer adjustment tap 4, connected to all three of the autotransformers 3, is formed on the body 11 at an upper portion thereof. The transformer adjustment tap 4 simultaneously controls the autotransformers 3 to equally transform the respective voltages of the powers supplied respectively to the autotransformers 3. After boosting the powers received respectively from the input terminals 1 at a specific transformation rate, the autotransformers 3 transfer the boosted powers respectively to three 3rd-harmonics cancellation transformers 5.

The three 3rd-harmonics cancellation transformers 5 are connected respectively to the three autotransformers 3 and are formed in parallel in the horizontal direction inside the body 11 at an inner center portion thereof. The 3rd harmonics cancellation transformers 5 are configured to cancel 3rd harmonics of the powers received from the autotransformers 3 so as to remove noise and then transfer the noise-removed powers individually to an output terminal section 7.

The output terminal section 7 is composed of three output terminals 6 connected respectively to the three 3rd-harmonics cancellation transformers 5, and is formed on the body 11 at a lower portion thereof. The three output terminals 6 of the output terminal section 7 are connected to the A, B and C phases of an underground cable conductor, respectively, so that corresponding power to be used for the underground cable impedance measurement is inputted to each of the A, B and C phase of the cable.

An overcurrent breaker 8 of a set capacity is formed between the input terminal section 2 and the 3rd-harmonics cancellation transformers 5 in order to prevent excessive current from being applied to the underground cable or to prevent each element of the power supply for measuring the underground cable line impedance from being damaged by overcurrents. The overcurrent breaker 8 is formed between the input terminal section 2 and the autotransformers 3, or between the autotransformers 3 and the 3rd-harmonics cancellation transformers 5, and automatically blocks an overcurrent having a predetermined current value or more when it occurs.

In addition, a plurality of wheels are formed on the bottom of the body 11 to facilitate movement of the power supply for measuring the line impedance of the underground cable.

A detailed description will now be given of the operation of a power supply for measuring the line impedance of an underground cable according to the embodiment of the present invention with reference to FIGS. 1 and 2.

The power supply for measuring the underground cable line impedance is installed at an impedance measurement position of the underground cable, and the input terminals 1 of the input terminal section 2 are individually connected to the utility power, and then the output terminals 6 of the output terminal section 7 are connected respectively to the A, B and C phases of the underground cable conductor.

The transformer adjustment tap 4 simultaneously controls the autotransformers 3 to equally boost the powers, received respectively from the input terminals 1, at a transformation rate in units of 0.5V within the range of 0 to 20V, and then transfer the boosted powers respectively to the 3rd-harmonics cancellation transformers 5.

The 3rd-harmonics cancellation transformers 5 cancel 3rd harmonics of the powers received from the autotransformers 3 to remove noise, and then transfer the noise-removed powers to the output terminal section 7. The powers outputted from the output terminals 6 of the output terminal section 7 are applied respectively to the A, B and C phases of the underground cable conductor, and the voltages, currents and power factors of the applied powers are measured, and then the measured values are calculated, so as to calculate the zero-phase-sequence impedance and the positive-phase-sequence impedance of the underground cable.

As apparent from the above description, a power supply for measuring the line impedance of an underground cable according to the present invention equally transforms the voltages of powers supplied respectively to a plurality of autotransformers by allowing a transformer adjustment tap to simultaneously control said plurality of autotransformers, and cancels 3rd-harmonics of the powers in 3rd-harmonics cancellation transformers to remove noise, thereby stably applying the powers boosted at the same transformation rate respectively to the phases of the underground cable. The present invention thus has advantages in that the amount of error in the measured impedance values of the underground cable line is largely reduced, and further, a power cut of the underground cable or breakage of impedance measurement equipment due to an abrupt voltage variance is prevented.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A power supply for measuring line impedance of an underground cable, comprising:
   a power source,
   an input terminal section including a plurality of input terminals connected individually to the power source;
   a plurality of autotransformers connected respectively to the input terminals of the input terminal section;
   a transformer adjustment tap connected to all of the autotransformers;
   a plurality of 3rd-harmonics cancellation transformers connected respectively to the autotransformers; and
   an output terminal section including a plurality of output terminals connected respectively to the 3rd-harmonics cancellation transformers, wherein said power supply measures line impedance of an underground cable.

2. The power supply according to claim 1, further comprising an overcurrent breaker of a specific capacity formed between the input terminal section and the 3rd-harmonics cancellation transformers.

* * * * *